(12) United States Patent
Lee et al.

(10) Patent No.: US 9,024,523 B2
(45) Date of Patent: May 5, 2015

(54) ORGANIC LIGHT EMITTING DISPLAY APPARATUS AND MANUFACTURING METHOD THEREOF

(71) Applicant: Samsung Display Co., Ltd., Yongin, Gyeonggi-Do (KR)

(72) Inventors: June-Woo Lee, Yongin (KR); Beohm-Rock Choi, Yongin (KR); Myung-Koo Hur, Yongin (KR); Jae-Ho Lee, Yongin (KR); Woo-Sik Jun, Yongin (KR); Hyun-Been Hwang, Yongin (KR)

(73) Assignee: Samsung Display Co., Ltd. (KR)

( * ) Notice: Subject to any disclaimer, the term of this patent is extended or adjusted under 35 U.S.C. 154(b) by 10 days.

(21) Appl. No.: 14/024,070

(22) Filed: Sep. 11, 2013

(65) Prior Publication Data

US 2014/0354141 A1     Dec. 4, 2014

(30) Foreign Application Priority Data

Jun. 4, 2013  (KR) .................. 10-2013-0064314

(51) Int. Cl.
*H05B 33/06*  (2006.01)
*H05B 33/10*  (2006.01)

(52) U.S. Cl.
CPC ............. *H05B 33/06* (2013.01); *H05B 33/10* (2013.01)

(58) Field of Classification Search
USPC .................................... 313/498–512
See application file for complete search history.

(56) References Cited

U.S. PATENT DOCUMENTS

| | | | |
|---|---|---|---|
| 7,030,553 B2 * | 4/2006 | Winters et al. | 313/504 |
| 8,593,058 B2 * | 11/2013 | Choi et al. | 313/504 |
| 2004/0075782 A1 | 4/2004 | Ha et al. | |
| 2005/0264184 A1 | 12/2005 | Park et al. | |
| 2005/0275339 A1 * | 12/2005 | Seo et al. | 313/503 |
| 2005/0280364 A1 * | 12/2005 | Omura et al. | 313/506 |
| 2007/0108440 A1 * | 5/2007 | Kubota | 257/40 |
| 2010/0084969 A1 * | 4/2010 | Choi et al. | 313/504 |
| 2013/0105821 A1 | 5/2013 | You et al. | |

FOREIGN PATENT DOCUMENTS

| | | | |
|---|---|---|---|
| KR | 1020020034449 A | 5/2002 | |
| KR | 1020050113413 A | 12/2005 | |
| KR | 1020060057946 A | 5/2006 | |
| KR | 1020130046843 A | 5/2013 | |

* cited by examiner

*Primary Examiner* — Ashok Patel
(74) *Attorney, Agent, or Firm* — Cantor Colburn LLP

(57) ABSTRACT

An organic light emitting display apparatus includes a pixel part including a pixel electrode, a light emitting layer and an opposite electrode, and a contact part in which the opposite electrode contacts a power line, wherein a first thickness of the opposite electrode in the pixel part is different from a second thickness of the opposite electrode in the contact part.

10 Claims, 5 Drawing Sheets

ORGANIC LIGHT EMITTING DISPLAY APPARATUS AND MANUFACTURING METHOD THEREOF

This application claims priority to Korean Patent Application No. 10-2013-0064314, filed on Jun. 4, 2013, and all the benefits accruing therefrom under 35 U.S.C. §119, the disclosure of which is incorporated herein in its entirety by reference.

BACKGROUND

1. Field

The invention relates to an organic light emitting display apparatus, and more particularly, to a bottom emission type organic light emitting display apparatus using an opposite electrode as a reflection electrode.

2. Description of Related Art

Generally, an organic light emitting display ("OLED") apparatus has a structure in which a thin film transistor ("TFT") and an organic light emitting device are provided so that the organic light emitting device receives an adequate driving signal from the TFT to emit light, thereby forming a desired image.

The TFT typically has a structure in which an active layer, a gate electrode, source and drain electrodes are stacked on a substrate. Therefore, when current is applied to the gate electrode through lines formed on the substrate, the current flows into the source and drain electrodes via the active layer, and simultaneously flows into a pixel electrode of the organic light emitting device, which is connected to the source and drain electrodes.

Furthermore, the organic light emitting device includes the pixel electrode, an opposite electrode facing the pixel electrode and a light emitting layer disposed between the pixel electrode and the opposite electrode. In this structure, when the current flows into the pixel electrode through the TFT as described above, an adequate voltage is formed between the opposite electrode and the pixel electrode, and thus, light is emitted by the light emitting layer, thereby an image is produced.

Here, the pixel electrode is separately provided for individual pixels partitioned by a pixel defining layer. However, the opposite electrode provided on a pixel defining layer as a single layer covers all the pixels.

SUMMARY

The invention provides an organic light emitting display apparatus in which an opposite electrode is structurally improved so as to effectively reduce a dark spot generation rate due to a short circuit of a pixel part, and also to effectively reduce film blistering with respect to a power line in a contact part, and a method of manufacturing the same.

According to an exemplary embodiment of the invention, there is provided an organic light emitting display apparatus including a pixel part including a pixel electrode, a light emitting layer and an opposite electrode and a contact part in which the opposite electrode contacts a power line, where a first thickness of the opposite electrode in the pixel part is different from a second thickness of the opposite electrode in the contact part.

The opposite electrode may have a first thickness in the pixel part and a second thickness greater than the first thickness in the contact part.

The opposite electrode may include a first layer disposed over the pixel part and the contact part, and a second layer further disposed on the first layer over the contact part.

The first thickness may be in a range of about 700 Angstroms (Å) to about 1,000 Angstroms (Å), and the second thickness may be equal to or greater than about 2,000 Å.

The opposite electrode may include a reflection electrode which reflects light generated from the light emitting layer toward the pixel electrode.

According to another exemplary embodiment of the invention, there is provided a method of manufacturing an organic light emitting display apparatus, the method including disposing a pixel electrode and a light emitting layer on a pixel part of a substrate, disposing a power line in a contact part formed on a substrate, and disposing an opposite electrode so that a first thickness of the opposite electrode in the pixel part is different from a second thickness of the opposite electrode in the contact part.

The opposite electrode may have the second thickness in the contact part greater than the first thickness in the pixel part.

The method may further include, disposing a first layer of the opposite electrode over the pixel part and the contact part and disposing a second layer of the opposite electrode on the first layer over the contact part.

The first thickness may be in a range of about 700 Å to about 1,000 Å, and the second thickness may be equal to or greater than about 2,000 Å.

The opposite electrode may include a reflection electrode which reflects light generated from the light emitting layer toward the pixel electrode.

As described above, in the organic light emitting display apparatus according to an exemplary embodiment of the invention, a dark spot generation rate due to the short circuit in the pixel part may be effectively reduced and a film blistering with respect to the power line in the contact part may be effectively prevented, and thus, images may be stably realized and product defects may be effectively reduced.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION

Figure 1:
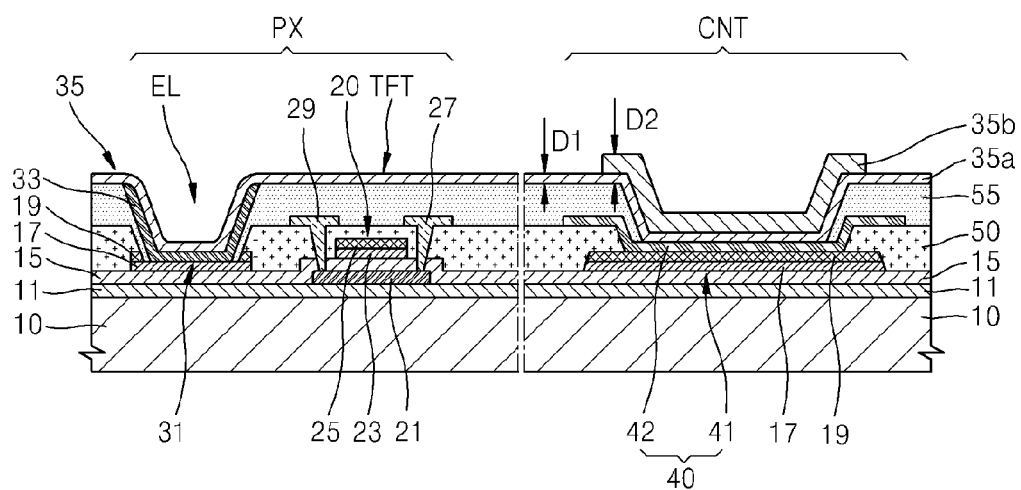
FIG. 1 is a cross-sectional view of an organic light emitting display apparatus according to an exemplary embodiment of the invention.

In a bottom emission type organic light emitting display ("OLED") device in which light generated from the light emitting layer is emitted toward the pixel electrode, since the opposite electrode is used as a reflection electrode, the opposite electrode may has a large thickness so that the light may be sufficiently reflected.

However, if particles exist on the pixel electrode, the light emitting layer disposed on the particles may not fully cover the pixel electrode to cause a gap therebetween. Here, if the opposite electrode is too thick, the opposite electrode is introduced into the gap to directly contact the pixel electrode, thereby causing a short circuit.

On the other hand, if the opposite electrode is too thin, reflectivity thereof may decrease, and also, a bonding force between the opposite electrode and the pixel defining layer may be deteriorated to cause blistering in a contact part connected to a power line. As a result, since power is not smoothly supplied into the opposite electrode, it may be difficult to produce clear images.

Thus, in order to realize a stable organic light emitting display apparatus, more effective methods for solving the above-described limitations are required.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Expressions such as "at least one of," when preceding a list of elements, modify the entire list of elements and do not modify the individual elements of the list.

Exemplary embodiments of the invention will be described below in more detail with reference to the accompanying drawings. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Like reference numerals refer to like elements throughout. Detailed descriptions of well-known functions or configurations will be omitted in order not to unnecessarily obscure the essence of the invention.

In the drawings, thicknesses of layers or regions may be exaggerated for clarity. Also, it will be understood that when an element, such as a layer, a film, a region, or a plate, is referred to as being 'on', 'connected to' or 'coupled to' another element, it may be directly on, connected or coupled to the other element or intervening elements may be present.

FIG. 1 is a schematic cross-sectional view of a portion of a bottom emission type organic light emitting display device according to an exemplary embodiment of the invention.

Referring to FIG. 1, an organic light emitting display apparatus according to an exemplary embodiment of the invention may include a pixel part PX including a thin film transistor TFT and an organic electroluminescent device EL, and a contact part CNT through which an opposite electrode 35 of the electroluminescent device EL is connected to a power line 40.

The thin film transistor TFT may include an active layer 21, a gate electrode 20, and source and drain electrodes 27 and 29. The gate electrode 20 may include a gate bottom electrode 23 and a gate top electrode 25. The gate bottom electrode 23 may include a transparent conductive material, and the gate top electrode 25 may include a metal material. A gate insulation layer 15 may be disposed between the gate electrode 20 and the active layer 21 to insulate therebetween. Source and drain regions into which high density impurities are injected may be disposed at both edges of the active layer 21 and thus may be connected to the source and drain electrodes 27 and 29.

Although not shown in cross-sectional views, the electroluminescent device EL may include a pixel electrode 31 connected to one of the source and drain electrodes 27 and 29 of the thin film transistor TFT, the opposite electrode 35 serving as a cathode, and a light emitting layer 33 disposed between the pixel electrode 31 and the opposite electrode 35. A reference numeral 50 denotes an interlayer dielectric and a reference numeral 55 denotes a pixel defining layer partitioning pixel regions.

First and second line layers 41 and 42 serving as the power line 40 contacting the opposite electrode 35 are provided in the contact part CNT. The first line layer 41 includes a same material as that of the gate electrode 20, and the first line layer 41 and the gate electrode 20 are disposed in and/or on a same layer. The second line layer 42 includes a same material as that of the source and drain electrodes 27 and 29, and the second line layer 42 and the source and drain electrodes 27 and 29 are disposed in and/or on a same layer. The opposite electrode 35 may directly contact the second line layer 42 of the power line 40 in the contact part CNT.

In a structure of the opposite electrode 35, the pixel part PX and the contact part CNT respectively have thicknesses D1 and D2 that are different from each other.

That is, in the pixel part PX, only a first layer 35a of the opposite electrode 35 is disposed in the pixel part PX. However, the opposite electrode 35 is provided as a double layer structure in which a second layer 35b is further disposed on the first layer 35a in the contact part CNT.

Here, the first layer 35a may have a thickness of about 700 Angstroms (Å) to about 1,000 Angstroms (Å). In a case of a bottom emission type pixel part PX, in order to totally reflect light emitted from the light emitting layer 33 toward the pixel electrode 31, the opposite electrode 35 may have a thickness of about 700 Å or more. In order to effectively prevent a short circuit from occurring even though micro-particles exist on the pixel electrode 31, the opposite electrode 35 may have a thickness of about 1,000 Å or less. This is done because, as described above, the light emitting layer 33 disposed on the micro-particles does not fully cover the pixel electrode 31 to cause a gap therebetween when the micro-particles exist on the pixel electrode 31. Here, when the opposite electrode 35 is too thick, the opposite electrode 35 may be introduced into the gap to directly contact the pixel electrode 31, thereby causing the short circuit. Thus, the first layer 35a of the opposite electrode 35 in the pixel part PX may have a thickness of about 700 Å to about 1,000 Å. Here, the first layer 35a may be provided in the contact part CNT as well as the pixel part PX.

Also, the second layer 35b of the opposite electrode 35 is disposed only in the contact part CNT to overlap the first layer 35a. Thus, the opposite electrode 35 in the contact part CNT may have a thickness D2 corresponding to a sum of thicknesses of the first layer 35a and the second layer 35b. Here, to effectively prevent film blistering from occurring, the opposite electrode 35 may have a thickness D2 of about 2,000 Å or more. That is, the opposite electrode 35 as shown in FIG. 1 is disposed on the pixel defining layer 55 to contact the power line 40. Here, due to a stepped portion of the pixel defining layer 55, the opposite electrode 35 may not completely contact the power line 40, thus causing the film blistering. Particularly, the more a thickness of the opposite electrode 35 decreases, the more a bonding force between the opposite electrode 35 and the pixel defining layer 55 decreases to further worsen the film blistering. However, when the opposite electrode 35 has a large thickness D2 of about 2,000 Å or more as described in the illustrated embodiment, the bonding force between the pixel defining layer 55 and the opposite electrode 35 may increase to effectively prevent the film blistering from occurring, thereby effectively solving the above-described limitation in which the opposite electrode 35 and the power line 40 do not completely contact each other, which results in the film blistering. Therefore, a film separation phenomenon may be effectively prevented to stably improve a power connection state of the contact part CNT.

Hereinafter, a manufacturing process of an exemplary embodiment of the organic light emitting display apparatus having the above-described structure will be described with reference to the accompanying drawings.

FIGS. 2A to 2G are cross-sectional views sequentially illustrating manufacturing processes of the organic light emitting display apparatus of FIG. 1.

Figure 2A:
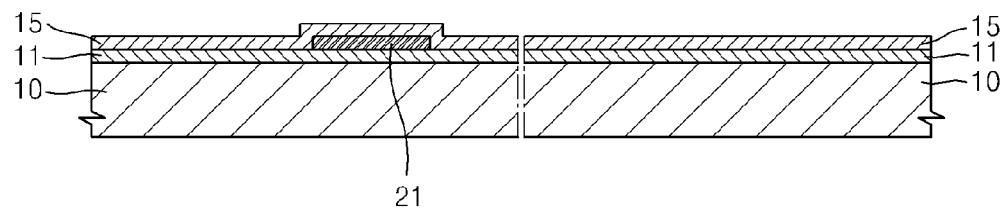
FIGS. 2A to 2G are cross-sectional views sequentially illustrating manufacturing processes of the organic light emitting display apparatus of FIG. 1.

Referring to FIG. 2A, a buffer layer 11 for providing smoothness of a substrate 10 and blocking impurities may be disposed on an upper surface of the substrate 10.

In an exemplary embodiment, the substrate 10 may include a transparent glass material using silicon dioxide ($SiO_2$) as a main component. However, the substrate 10 is not limited to the above-described material. In an exemplary embodiment, the substrate 10 may include various materials such as a transparent plastic material and a metal material, for example.

The active layer 21 of the thin film transistor TFT is disposed on the buffer layer 11. The active layer 21 may include a polycrystalline silicon material and may be patterned using a mask process. In an alternative exemplary embodiment, the active layer 21 may include an oxide semiconductor. In an exemplary embodiment, the oxide semiconductor may include an oxide of a material selected from the groups 12, 13, and 14 metal elements such as zinc (Zn), indium (In), gallium (Ga), tin (Sn), cadmium (Cd), germanium (Ge), or hafnium (Hf), and combinations thereof, for example. In an exemplary embodiment, a semiconductor active layer 21 may include G-I—Z—O[$(In_2O_3)a(Ga_2O_3)b(ZnO)c$], for example, where a, b, and c are real numbers which satisfy conditions of a≥0, b≥0, and c>0.

Thereafter, a gate insulation layer 15 may be disposed on the active layer 21 patterned using a mask. In the gate insulation layer 15, an inorganic insulating layer such as silicon nitride (SiNx) or silicon oxide (SiOx) may be deposited using a plasma-enhanced chemical vapor deposition ("PECVD"), atmospheric pressure CVD ("APCVD") or low pressure CVD ("LPCVD") method.

Figure 2B:
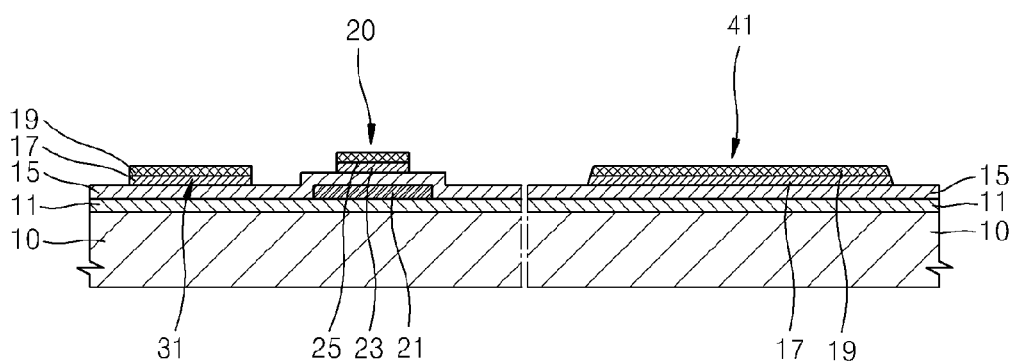

As shown in FIG. 2B, after a first conductive layer 17 and a second conductive layer 19 are sequentially deposited on the gate insulation layer 15, a first line layer 41 is patterned to form a pixel electrode 31 of an organic electroluminescent device EL, a gate electrode 20 of the thin film transistor TFT, and a power line 40 of the contact part CNT.

Here, the first conductive layer 17 may include at least one material selected from transparent materials such as indium tin oxide ("ITO"), indium zinc oxide ("IZO"), zinc oxide (ZnO), and indium oxide ($In_2O_3$), and a combination thereof. The second conductive layer 19 may include at least one material selected from Ag, Mg, Al, Pt, Pd, Au, Ni, Nd, Ir, Cr, Li, Ca, Mo, Ti, W, MoW, and Al/Cu, and a combination thereof.

In an exemplary embodiment, the first conductive layer 17 and the second conductive layer 19 are sequentially stacked over an entire surface of the substrate 10 and then patterned using the mask process to form the gate electrode 20, the pixel electrode 31, and the first line layer 41.

The gate electrode 20 corresponds to a center portion of the active layer 21. When n-type or p-type impurities are doped into the active layer 21 using the gate electrode 20 as a mask, a channel part is formed in a portion of the active layer 21 covered by the gate electrode 20, and source and drain parts are disposed in edges of the active layer 21 which are not covered by the gate electrode 20.

Figure 2C:
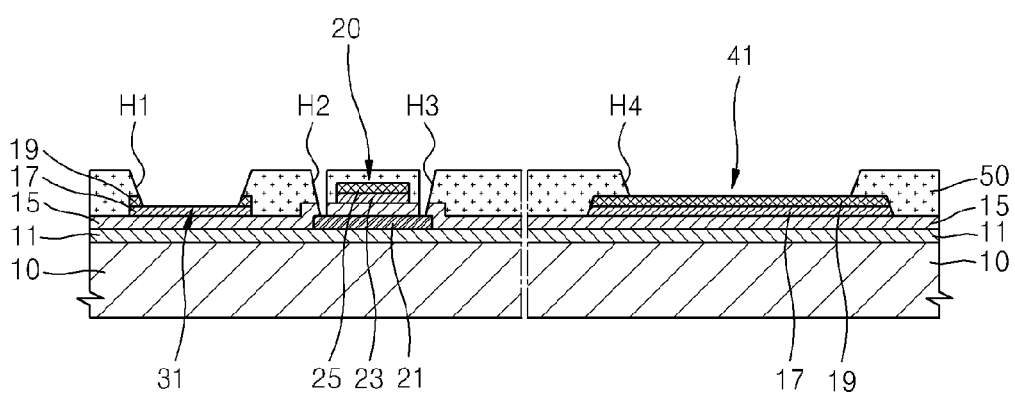

Referring to FIG. 2C, an interlayer dielectric 50 is disposed on the entire surface of the substrate 10, and then openings H1 to H4 are formed using the mask process.

The interlayer dielectric 50 is formed by performing spin coating using at least one organic insulating material selected from polyimide, polyamide, acryl resin, benzocyclobutene, and phenol resin, and a combination thereof. The interlayer dielectric 50 may include not only the organic insulating material, but also the same inorganic insulating material as the gate insulation layer 15. In an alternative exemplary embodiment, the organic insulating material and the inorganic insulating material are alternately formed in the interlayer dielectric 50.

The interlayer dielectric 50 is patterned to form the openings H1 to H4 exposing the pixel electrode 31, the source and drain parts 27 and 29 corresponding to the edges of the active layer 21, and the first line layer 41.

Figure 2D:
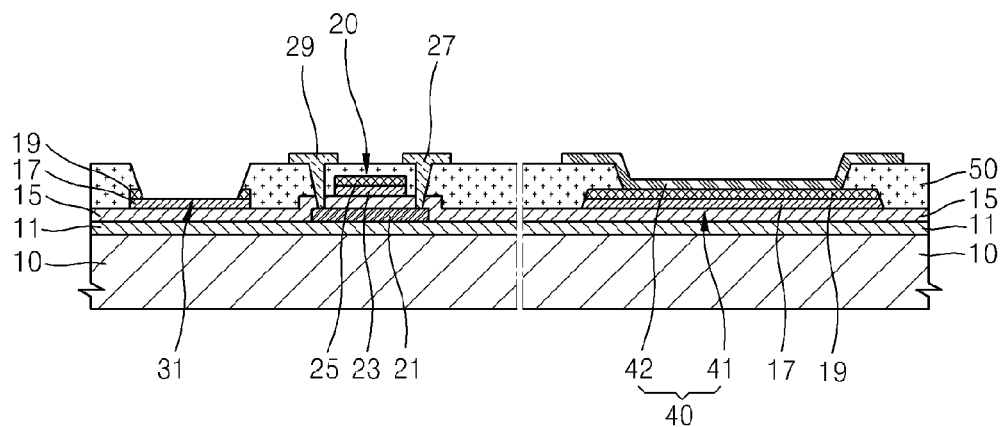

Referring to FIG. 2D, a third conductive layer is deposited on the interlayer dielectric 50 above the entire surface of the substrate 10 and patterned to form the source and drain electrodes 27 and 29 of the thin film transistor TFT and a second line layer 42 of the power line 40. The third conductive layer may include the same conductive material as that of the above-described first or second conductive layer 17 or 19. In an alternative exemplary embodiment, the third conductive layer may include Mo/Al/Mo. The third conductive layer is patterned to form the source and drain electrodes 27 and 29 and the second line layer 42. Here, the pixel electrode 31 is etched to expose the first line layer 17. Although not shown in the cross-sectional views, one of the source and drain electrodes 27 and 29 is connected to the pixel electrode 31.

Figure 2E:
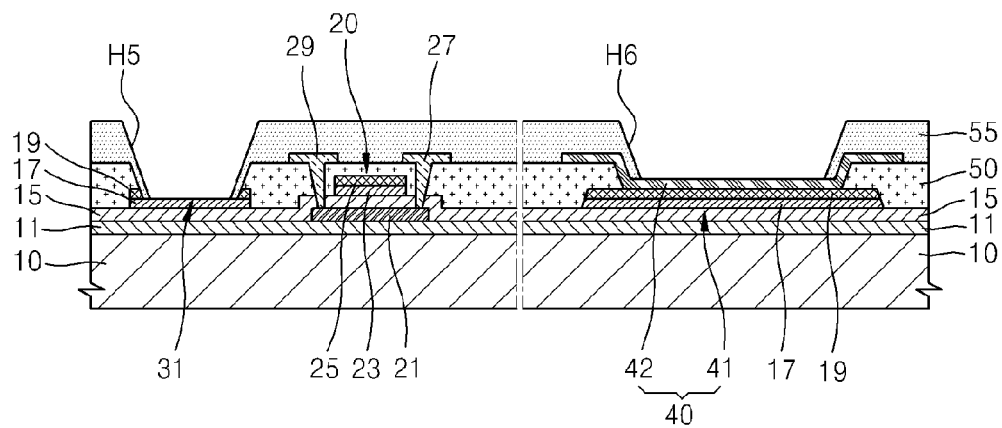

Referring to FIG. 2E, a pixel defining layer 55 is disposed on the substrate 10. The pixel defining layer 55 may be formed by performing spin coating using at least one organic insulating material selected from polyimide, polyamide, acryl resin, benzocyclobutene, and phenol resin, and a combination thereof. The pixel defining layer 55 is patterned to form openings H5 and H6 for exposing a central portion of the pixel electrode 31 and the second line layer 42.

Figure 2F:
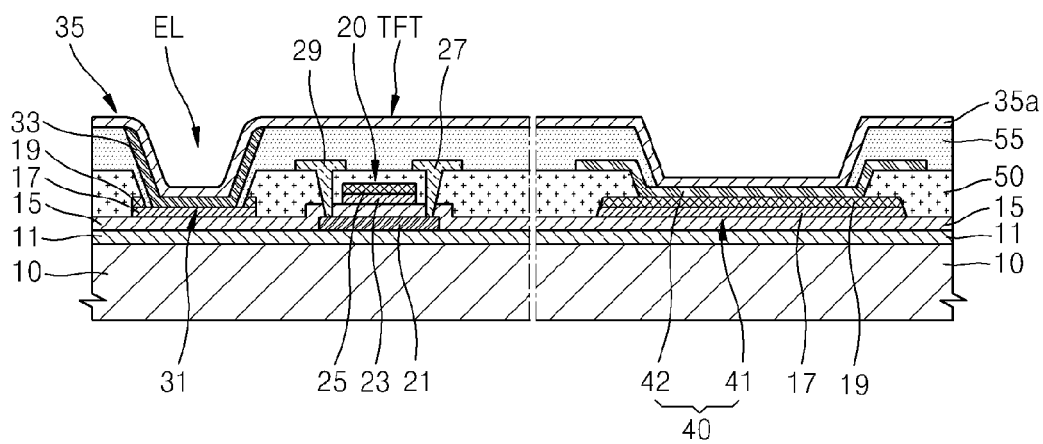

As shown in FIG. 2F, a light emitting layer 33 is disposed in the opening H5 exposing the pixel electrode 31, and then an opposite electrode 35 is disposed on the light emitting layer 33.

The light emitting layer 33 may include a low molecular weight organic layer or a polymer organic layer. When the light emitting layer 33 includes the low molecular weight organic layer, the light emitting layer 33 may include a hole injection layer ("HIL"), a hole transport layer ("HTL"), an organic emission layer ("EML") an electron transport layer ("ETL"), and an electron injection layer ("EIL") which are stacked in a single layer or a multi-layered structure. In one exemplary embodiment, the organic material may include copper phthalocyanine ("CuPc"), N,N1-dinaphthalene-1-yl-N,N'-diphenyl-benzidine ("NPB"), and tris(8-hydroxyquinoline)aluminum ($Alq_3$), for example.

In an exemplary embodiment, the polymer organic layer may include an HTL and an EML. In the illustrated exemplary embodiment, the HTL may include poly(3,4-ethylenedioxythiophene) ("PEDOT"), and the EML may include a polymer organic material such as poly-phenylenevinylene ("PPV")-based or polyfluorene-based polymer organic material.

In the light emitting layer 33, one unit pixel may include sub pixels respectively emitting red, green, and blue light. In an alternative exemplary embodiment, a separate light emitting material may not be disposed in each sub pixel, but the light emitting layer may be commonly disposed over positions of the sub pixels. Here, in the light emitting layer 33, layers respectively containing the materials emitting red, green, and blue light may be vertically stacked, or the materials emitting red, green, and blue light may be mixed within one layer for example. In an exemplary embodiment, when white light is emitted, combinations of other colors may be possible. Additionally, a color conversion layer for converting the emitted white light into a predetermined color or a color filter may be further provided.

In the opposite electrode 35, a first layer 35a is disposed on the entire surface of the substrate 10 including the pixel part PX and the contact part CNT, and the first layer 35a is connected to the second line layer 42 of the power line 40 through the opening H6. Here, the first layer 35a may have a thickness D1 of about 700 Å to about 1,000 Å as described above.

Figure 2G:
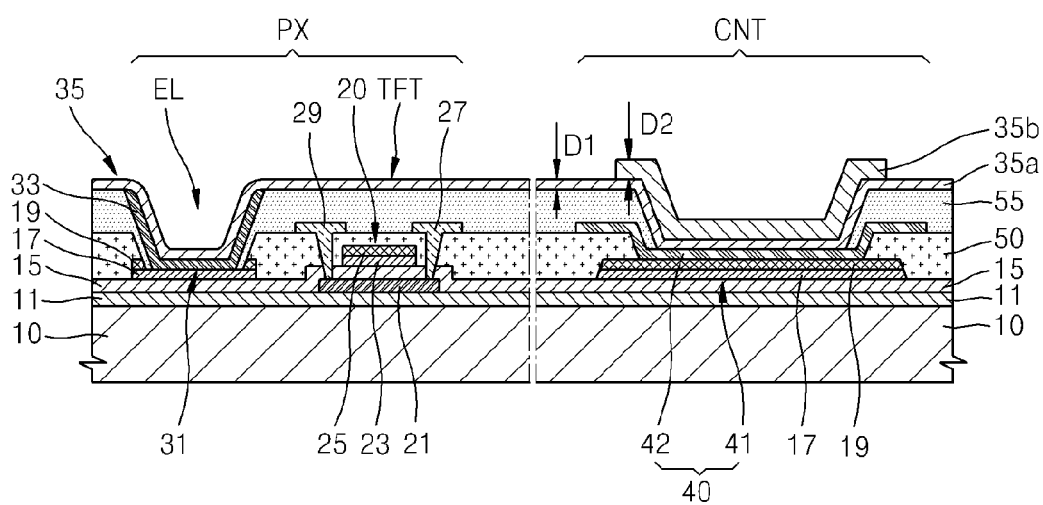
Figure 3A:
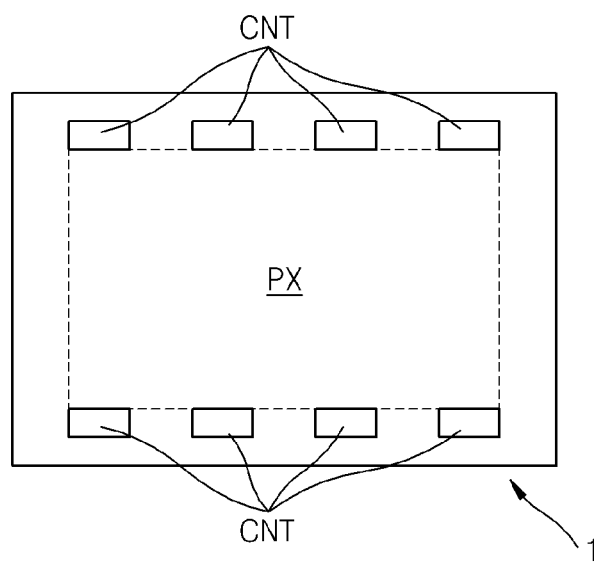
FIGS. 3A and 3B are plan views illustrating an exemplary embodiment of a mask used while a second layer of an opposite electrode of FIG. 2G is deposited.
Figure 3B:
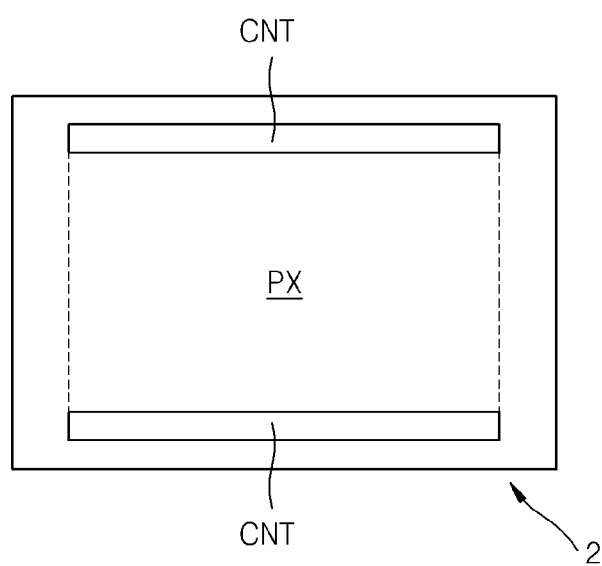

Referring to FIG. 2G, a second layer 35b is disposed on the first layer 35a of the opposite electrode 35 only in the contact part CNT and has a total thickness D2 of about 2,000 Å or more. FIGS. 3A and 3B are views illustrating an exemplary embodiment of masks 1 and 2 used while the second layer 35b of an opposite electrode is deposited. The second layer 35b may be precisely disposed only on the contact part CNT using the mask 1 having patterns as shown in FIG. 3A and as described in the illustrated embodiment. In an alternative exemplary embodiment, the second layer 35b may be disposed on the entire region except for the pixel part PX using the mask 2 having patterns as shown in FIG. 3B.

In a bottom emission type organic light emitting display apparatus manufactured through the above-described process, since the opposite electrode 35 has an adequate thickness D1 to secure reflectance efficiency and to effectively prevent a short-circuit in the pixel part PX, and, the opposite electrode 35 has an adequate thickness D2 to effectively prevent film blistering in the contact part CNT, limitations due to the thicknesses of the opposite electrode 35 may be effectively solved. When the opposite electrode 35 has the large thickness D2, although the pixel defining layer 55 is blistered, a possibility of disconnection of the opposite electrode 35 may be effectively reduced, thus securing a stable connection of the opposite electrode 35.

As described above, in the organic light emitting display apparatus and the manufacturing method thereof according to exemplary embodiments of the invention, a dark spot generation rate due to a short circuit in the pixel part may be effectively reduced and film blistering with respect to the power line in the contact part may be effectively prevented, and thus, images may be stably realized and product defects may be effectively reduced.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. An organic light emitting display apparatus comprising:
  a pixel part which generates and emits light, the pixel part comprising:
    an organic light emitting device comprising a pixel electrode, a light emitting layer and an opposite electrode; and
    a thin film transistor which provides a driving signal to the organic light emitting device; and
  a contact part disposed adjacent to the pixel part, in which the opposite electrode contacts a power line and from which power is supplied to the pixel part opposite electrode via the power line, wherein a first thickness of the opposite electrode within the pixel part comprising the organic light emitting device and the thin film transistor, is different from a second thickness of the opposite electrode within the contact part comprising the opposite electrode in contact with the power line.

2. The organic light emitting display apparatus of claim 1, wherein the second thickness in the contact part is greater than the first thickness in the pixel part.

3. The organic light emitting display apparatus of claim 2, wherein the opposite electrode comprises:
   a first layer disposed in the pixel part and in the contact part; and
   a second layer disposed on the first layer in the contact part.

4. The organic light emitting display apparatus of claim 2, wherein
   the first thickness is in a range of about 700 Å to about 1,000 Å, and
   the second thickness is equal to or greater than about 2,000 Å.

5. The organic light emitting display apparatus of claim 1, wherein the opposite electrode comprises a reflection electrode which reflects the light generated from the light emitting layer toward the pixel electrode.

6. A method of manufacturing an organic light emitting display apparatus, the method comprising:
   disposing a thin film transistor, an opposite electrode, a pixel electrode and a light emitting layer on a substrate within a pixel part which generates and emits light; and
   disposing the opposite electrode in contact with a power line on the substrate within a contact part which is adjacent to the pixel part and supplies power to the pixel part opposite electrode via the power line,
   wherein a first thickness of the opposite electrode within the pixel part comprising the thin film transistor, the pixel electrode and the light emitting layer and, is different from a second thickness of the opposite electrode within the contact part comprising the opposite electrode in contact with the power line.

7. The method of claim 6, wherein the second thickness in the contact part is equal to or greater than the first thickness in the pixel part.

8. The method of claim 7, wherein disposing the opposite electrode comprises:
   disposing a first layer of the opposite electrode in the pixel part and in the contact part; and
   disposing a second layer of the opposite electrode on the first layer in the contact part.

9. The method of claim 7, wherein
   the first thickness is in a range of about 700 Å to about 1,000 Å, and
   the second thickness is equal to or greater than about 2,000 Å.

10. The method of claim 7, wherein the opposite electrode comprises a reflection electrode which reflects the light generated from the light emitting layer toward the pixel electrode.

* * * * *